United States Patent
Singh et al.

(10) Patent No.: US 11,316,523 B1
(45) Date of Patent: Apr. 26, 2022

(54) MINIMIZING ARTIFACTS RESULTING FROM CLOCK SWITCHING OF SAMPLED DATA CONVERTERS

(71) Applicant: Cirrus Logic International Semiconductor Ltd., Edinburgh (GB)

(72) Inventors: Saurabh Singh, Cedar Park, TX (US); Jaimin Mehta, Austin, TX (US); Sriram Balasubramanian, Austin, TX (US); Anindya Bhattacharya, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/308,741

(22) Filed: May 5, 2021

(51) Int. Cl.
*H03L 7/099* (2006.01)
*G06F 1/12* (2006.01)
*H03L 7/093* (2006.01)

(52) U.S. Cl.
CPC .............. *H03L 7/0991* (2013.01); *G06F 1/12* (2013.01); *H03L 7/093* (2013.01)

(58) Field of Classification Search
None
See application file for complete search history.

(56) References Cited

U.S. PATENT DOCUMENTS

| | | | |
|---|---|---|---|
| 9,634,678 B1 * | 4/2017 | Caffee | H03L 7/0891 |
| 11,095,296 B2 * | 8/2021 | Hermoso | H03B 5/1265 |
| 2013/0257485 A1 * | 10/2013 | Nikaeen | H03B 21/00 |
| | | | 327/107 |

* cited by examiner

*Primary Examiner* — Cassandra F Cox
(74) *Attorney, Agent, or Firm* — Jackson Walker L.L.P.

(57) ABSTRACT

A system may include a digitally-controlled oscillator configured to generate an output clock signal based on a control signal received at an input of the digitally-controlled oscillator and a control circuit configured to calculate an error signal between the output clock signal and an external reference clock signal, filter the error signal to generate a correction signal, generate the control signal based on the correction signal, and switch between a first mode of operation and a second mode of operation without artifacts on the correction signal during switching between the first mode and the second mode.

24 Claims, 4 Drawing Sheets

MINIMIZING ARTIFACTS RESULTING FROM CLOCK SWITCHING OF SAMPLED DATA CONVERTERS

FIELD OF DISCLOSURE

The present disclosure relates in general to circuits for electronic devices, including without limitation personal audio devices such as wireless telephones and media players, and more specifically, to minimizing artifacts occurring from switching between clock signals used by a sampled data converter.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. In some embodiments, such circuitry may include a sampled data converter that may convert data from one format to another. For example, a sampled data converter may include a digital-to-analog converter configured to convert a digital signal to an equivalent analog signal. As another example, a sampled data converter may include an analog-to-digital converter configured to convert an analog signal to an equivalent digital signal. In addition to receiving an input (e.g., analog or digital) signal to be converted, a sampled data converter may also receive a clock signal for synchronizing sampling of the input signal.

In some instances, it may be advantageous to enable a sampled data converter to synchronize sampling from a selected sampling clock selected from two or more clocks. For example, a system may switch between a low power mode in which a low-performance/low-power clock is used for synchronizing sampling in a sampled data converter and a high-power mode which uses a high-performance (e.g., higher accuracy)/high-power clock for synchronizing sampling in a sampled data converter.

However, switching between clock signals for a sampled data converter may lead to signal artifacts on the output signal of the sampled data converter, which in audio applications, may lead to such artifacts being perceptible (e.g., as audible "pops" and/or "clicks") to a user of a personal audio device comprising the sampled data converter. Accordingly, systems and methods for minimizing such artifacts are desirable.

SUMMARY

In accordance with the teachings of the present disclosure, one or more disadvantages and problems associated with existing approaches to switching between clocks for a sampled data converter may be reduced or eliminated.

In accordance with embodiments of the present disclosure, a system may include a digitally-controlled oscillator configured to generate an output clock signal based on a control signal received at an input of the digitally-controlled oscillator and a control circuit configured to calculate an error signal and the output clock signal to an external reference clock signal, filter the error signal to generate a correction signal, generate the control signal based on the correction signal, and switch between a first mode of operation and a second mode of operation without artifacts on the correction signal during switching between the first mode and the second mode.

In accordance with embodiments of the present disclosure, a method may include, in a system including a digitally-controlled oscillator configured to generate an output clock signal based on a control signal received at an input of the digitally-controlled oscillator, calculating an error signal between the output clock signal and an external reference clock signal, filtering the error signal to generate a correction signal, generating the control signal based on the correction signal, and switching between a first mode of operation and a second mode of operation without artifacts on the correction signal during switching between the first mode and the second mode.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
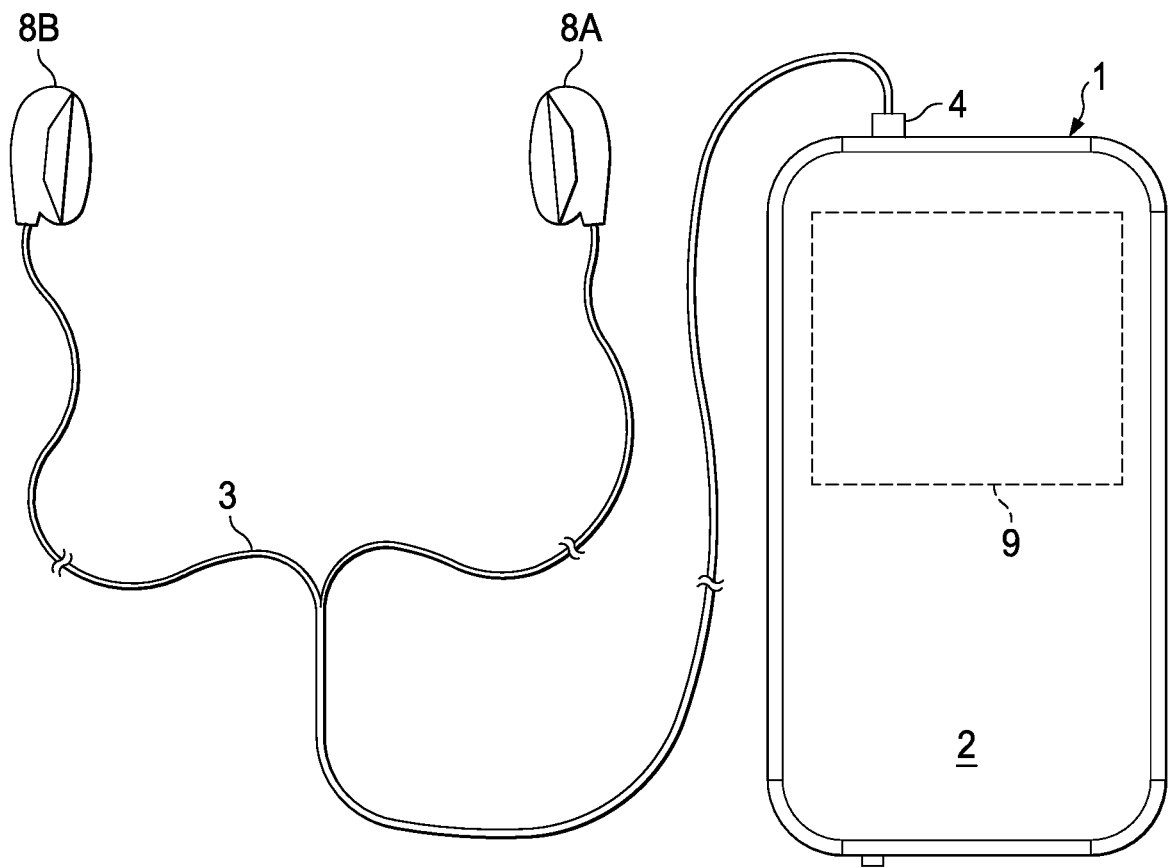
FIG. 1 illustrates an example personal audio device, in accordance with embodiments of the present disclosure.

FIG. 1 illustrates an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
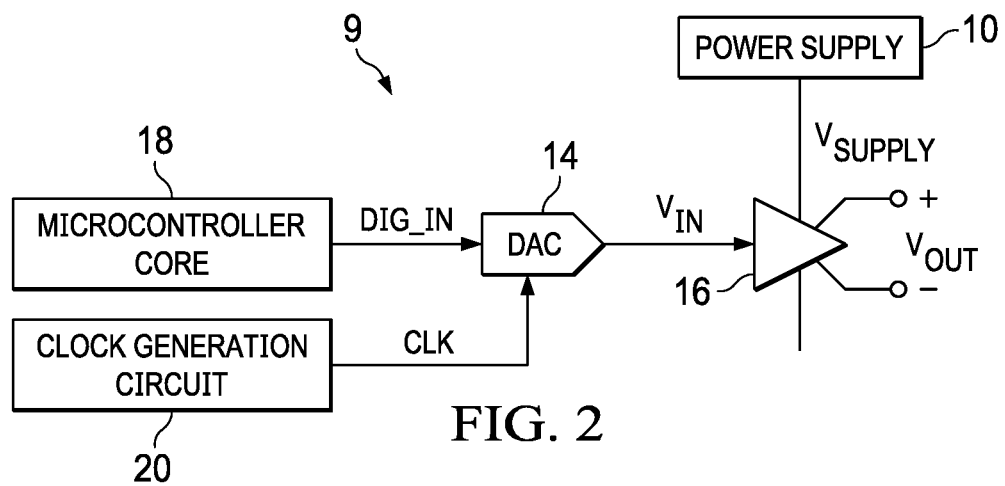
FIG. 2 illustrates a block diagram of selected components of an example integrated circuit of a personal audio device, in accordance with embodiments of the present disclosure.

FIG. 2 illustrates a block diagram of selected components of an example IC 9 of a personal audio device, in accordance with embodiments of the present disclosure. In some embodiments, example IC 9 shown in FIG. 2 may be used to implement IC 9 of FIG. 1. As shown in FIG. 2, a microcontroller core 18 may supply a digital input signal DIG_IN to a digital-to-analog converter (DAC) 14, which may convert digital input signal DIG_IN to an analog signal $V_{IN}$. As shown in FIG. 2, DAC 14 may comprise a sampled data converter that samples digital input signal DIG_IN in accordance with a clock signal CLK generated by a clock generation circuit 20. DAC 14 may supply analog signal $V_{IN}$ to an amplifier 16 which may amplify or attenuate input signal $V_{IN}$ to provide a differential output signal $V_{OUT}$, which may operate a speaker, a headphone transducer, a line level signal output, and/or other suitable output. In some embodiments, DAC 14 may be an integral component of amplifier 16. A power supply 10 may provide the power supply rail inputs of amplifier 16. In some embodiments, power supply 10 may comprise a switched-mode power converter, as described in greater detail below. Although FIGS. 1 and 2 contemplate that IC 9 resides in a personal audio device, systems and methods described herein may also be applied to electrical and electronic systems and devices other than a personal audio device, including systems for use in a computing device larger than a personal audio device, such as an automobile, a building, or other structure. Further, systems and methods described herein may also be applied to electrical and electronic systems and devices other than audio devices and audio transducers, such as vibro-haptic transducers, piezoelectric transducers, or other transducers.

Figure 3:
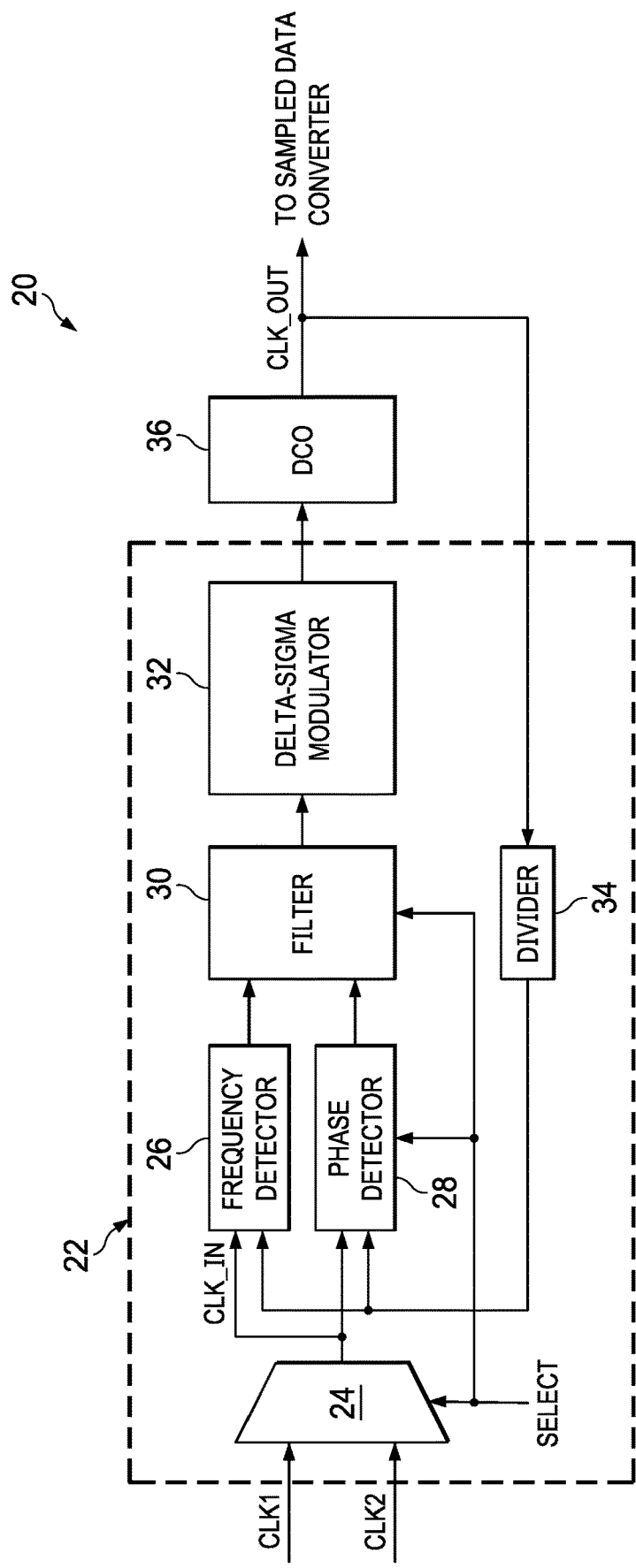
FIG. 3 illustrates a block diagram of selected components of an example clock generation circuit, in accordance with embodiments of the present disclosure.

FIG. 3 illustrates a block diagram of selected components of an example clock generation circuit 20, in accordance with embodiments of the present disclosure. As shown in FIG. 3, clock generation circuit 20 may include a digital subcircuit 22 and digitally-controlled oscillator (DCO) 36. As also shown in FIG. 3, digital subcircuit 22 may include a multiplexer 24, a frequency detector 26, a phase detector 28, a filter 30, a delta-sigma modulator 32, and a feedback divider 34.

Multiplexer 24 may receive two reference clock signals, CLK1 and CLK2, and selectively output one of reference clock signals CLK1 and CLK2 as an input clock signal CLK_IN, based on select signal SELECT. In some embodiments, reference clock signal CLK1 may be a low-power/low-performance clock signal, such as may be generated by a frequency-locked loop, and reference clock signal CLK2 may be a high-power/high-performance clock signal (e.g., requiring more power than reference clock signal CLK1 but having higher accuracy), such as may be generated by a digital phase locked loop. Although not explicitly shown in FIG. 3, in some embodiments, a divider may be present at the output of multiplexer 24 to frequency divide the selected reference clock signal in order to generate input clock signal CLK_IN.

Frequency detector 26 may include any suitable system, device, or apparatus configured to receive input clock signal CLK_IN and an output clock signal CLK_OUT (e.g., as divided by divider 34) and generate a frequency error signal based on a difference in frequency between input clock signal CLK_IN and output clock signal CLK_OUT.

Phase detector 28 may include any suitable system, device, or apparatus configured to receive input clock signal CLK_IN and an output clock signal CLK_OUT (e.g., as divided by divider 34) and generate a phase error signal based on a difference in phase between input clock signal CLK_IN and output clock signal CLK_OUT. As shown in FIG. 3, phase detector 28 may also receive select signal SELECT, which may selectively disable and enable phase detector 28 (e.g., disable phase detector 28 when reference clock signal CLK1 is selected by multiplexer 24, enable phase detector 28 when reference clock signal CLK2 is selected by multiplexer 24).

Filter 30 may include any suitable filter that integrates (over time) and normalizes the frequency error signal generated by frequency detector 26 and/or the phase error signal generated by phase detector 28 to generate a correction signal indicative of a correction to be applied to output clock signal CLK_OUT in order to synchronize output clock signal CLK_OUT to input clock signal CLK_IN. For example, in some embodiments, filter 30 may comprise a filter with proportional, integral, and derivative paths wherein each such path receives the frequency error signal and/or phase error signal in order to collectively generate the correction signal.

Delta-sigma modulator 32 may include any suitable system, device, or apparatus configured to modulate the correction signal generated by filter 30 to generate an appropriate control signal DCO 36 for generating output clock signal CLK_OUT as a function of the correction signal.

Divider 34 may include any suitable system, device, or apparatus configured to receive output clock signal CLK_OUT and provide any suitable frequency division to output clock signal CLK_OUT.

DCO 36 may include any suitable system, device, or apparatus configured to generate output clock signal CLK_OUT with a frequency that is a function of a control signal (e.g., generated by delta-sigma modulator 32) received at the input of DCO 36.

Figure 4:
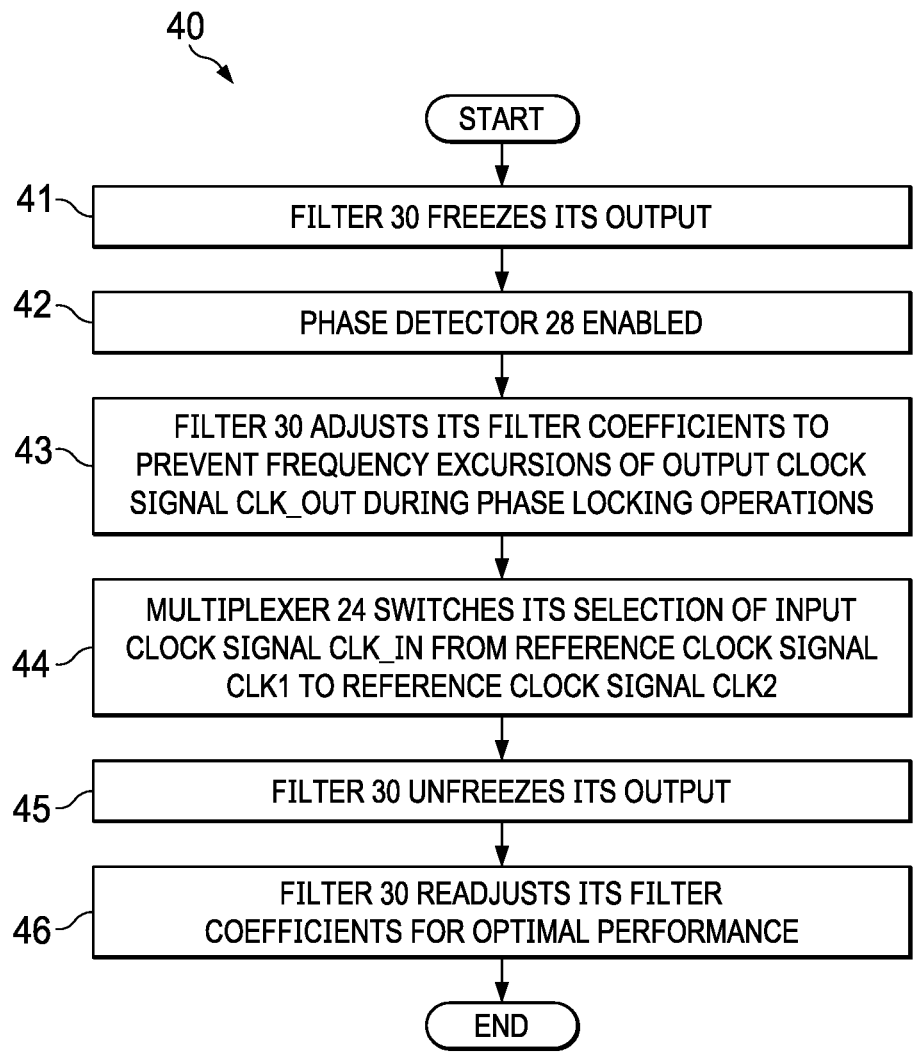
FIG. 4 illustrates a flow chart of an example method for minimizing artifacts when switching from a low-power/low-performance clock to a high-power/high-performance clock, in accordance with embodiments of the present disclosure.

FIG. 4 illustrates a flow chart of example method 40 for minimizing artifacts when switching from a low-power/low-performance clock to a high-power/high-performance clock, in accordance with embodiments of the present disclosure. According to certain embodiments, method 40 may begin at step 41. As noted above, teachings of the present disclosure may be implemented in a variety of configurations of clock generation circuit 20 as shown in FIG. 3. As such, the preferred initialization point for method 40 and the order of the steps comprising method 40 may depend on the implementation chosen. In these and other embodiments, method 40 may be implemented as firmware, software, applications, functions, libraries, or other instructions.

At step 41, in response to switching of control signal SELECT, to indicate switching from a low-power/low-performance clock (e.g., reference clock signal CLK1) to a high-power/high-performance clock (e.g., reference clock signal CLK2), filter 30 may freeze its output (e.g., freeze the compensation signal generated by filter 30). During freezing of the output of filter 30, delta-sigma modulator 32 and DCO 36 may continue operating in order to maintain the frequency of output clock signal CLK_OUT.

At step 42, in response to switching of control signal SELECT and completion of the foregoing step, phase detector 28 may be enabled, and may begin providing a phase error signal that may be used by filter 30 to allow clock generation circuit 20 to phase lock output clock signal CLK_OUT to input clock signal CLK_IN. At step 43, filter 30 may adjust its filter coefficients to prevent frequency excursions of output clock signal CLK_OUT during such phase locking operations (e.g., increasing filter bandwidth).

At step 44, in response to switching of control signal SELECT and completion of the foregoing steps, multiplexer 24 may switch its selection of input clock signal CLK_IN from the low-power/low-performance clock (e.g., reference clock signal CLK1) to the high-power/high-performance clock (e.g., reference clock signal CLK2).

At step 45, after completion of the foregoing steps, filter 30 may unfreeze its output, and may again vary its output in accordance with error signals received at its input. At step 46, also in response to completion of steps 41-44 and once clock signal CLK_OUT is phase locked to input clock signal CLK_IN, filter 30 may readjust its filter coefficients for optimal performance.

Although FIG. 4 discloses a particular number of steps to be taken with respect to method 40, method 40 may be executed with greater or fewer steps than those depicted in FIG. 4. In addition, although FIG. 4 discloses a certain order of steps to be taken with respect to method 40, the steps comprising method 40 may be completed in any suitable order.

Method 40 may be implemented using clock generation circuit 20, components thereof, or any other system operable to implement method 40. In certain embodiments, method 40 may be implemented partially or fully in software and/or firmware embodied in computer-readable media.

In some embodiments, the steps of method 40 may be synchronized to a specific event (such as a rising edge or falling edge of a reference clock or the clock generated by DCO 36) to minimize perturbation in the error signals and/or correction signals generated by clock generation circuit 20.

Figure 5:
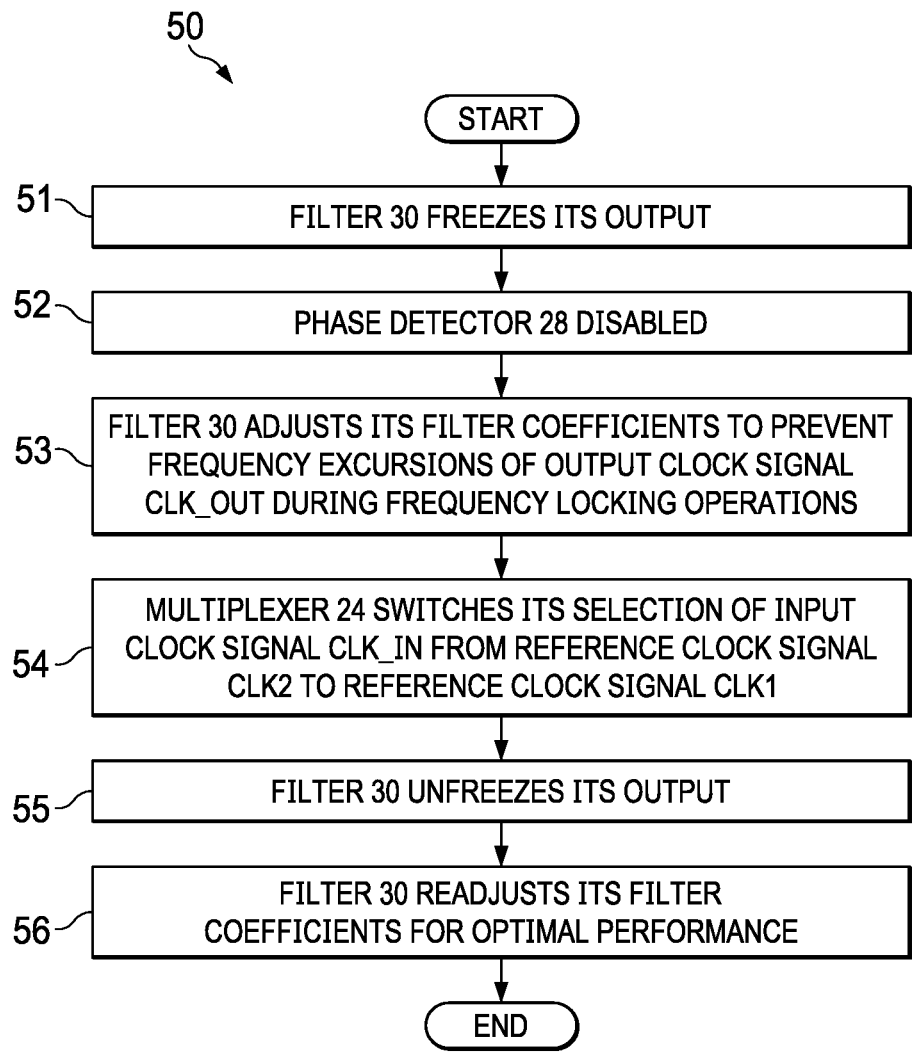
FIG. 5 illustrates a flow chart of an example method for minimizing artifacts when switching from a high-power/high-performance clock to a low-power/low-performance clock, in accordance with embodiments of the present disclosure.

FIG. 5 illustrates a flow chart of example method 50 for minimizing artifacts when switching from a high-power/high-performance clock to a low-power/low-performance clock, in accordance with embodiments of the present disclosure. According to certain embodiments, method 50 may begin at step 51. As noted above, teachings of the present disclosure may be implemented in a variety of configurations of clock generation circuit 20 as shown in FIG. 3. As such, the preferred initialization point for method 50 and the order of the steps comprising method 50 may depend on the implementation chosen. In these and other embodiments, method 50 may be implemented as firmware, software, applications, functions, libraries, or other instructions.

At step 51, in response to switching of control signal SELECT, to indicate switching from a high-power/high-performance clock (e.g., reference clock signal CLK2) to a low-power/low-performance clock (e.g., reference clock signal CLK1), filter 30 may freeze its output (e.g., freeze the compensation signal generated by filter 30). During freezing of the output of filter 30, delta-sigma modulator 32 and DCO 36 may continue operating in order to maintain the frequency of output clock signal CLK_OUT.

At step 52, in response to switching of control signal SELECT and completion of the foregoing step, phase detector 28 may be disabled. At step 53, filter 30 may adjust its filter coefficients to prevent frequency excursions of output clock signal CLK_OUT during frequency locking operations of frequency detector 26 (e.g., decreasing filter bandwidth).

At step 54, in response to switching of control signal SELECT and completion of the foregoing steps, multiplexer 24 may switch its selection of input clock signal CLK_IN from the high-power/high-performance clock (e.g., reference clock signal CLK2) to the low-power/low-performance clock (e.g., reference clock signal CLK1).

At step 55, after completion of the foregoing steps, filter 30 may unfreeze its output, and may again vary its output in accordance with error signals received at its input. At step 56, also in response to completion of steps 41-44 and once output clock signal CLK_OUT has frequency locked to input clock signal CLK_IN, filter 30 may readjust its filter coefficients for optimal performance.

Although FIG. 5 discloses a particular number of steps to be taken with respect to method 50, method 50 may be executed with greater or fewer steps than those depicted in FIG. 5. In addition, although FIG. 5 discloses a certain order of steps to be taken with respect to method 50, the steps comprising method 50 may be completed in any suitable order.

Method 50 may be implemented using clock generation circuit 20, components thereof, or any other system operable to implement method 50. In certain embodiments, method 50 may be implemented partially or fully in software and/or firmware embodied in computer-readable media.

In some embodiments, the steps of method 50 may be synchronized to a specific event (such as a rising edge or falling edge of a reference clock or the clock generated by DCO 36) to minimize perturbation in the error signals and/or correction signals generated by clock generation circuit 20.

Although FIG. 2 contemplates use of clock generation circuit 20 to generate a clock signal for DAC 14, it is understood that the systems and methods described herein may be applied to clock generation for any suitable type of data converter that depends on a clock signal for synchronizing its operations, including without limitation, digital-to-analog converters, analog-to-digital converters, frequency rate converters, and/or any other suitable type of signal or data converter.

Further, although the foregoing contemplates the use of data conversion in audio circuits, it is understood that the systems and methods described herein may be applied to any other type of circuit in which an electronic signal within a signal path may be affected by a change in a clock signal that synchronizes operation of a component of such signal path.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
    a digitally-controlled oscillator configured to generate an output clock signal based on a control signal received at an input of the digitally-controlled oscillator; and
    a control circuit configured to:
        calculate an error signal between the output clock signal and an external reference clock signal;
        filter the error signal to generate a correction signal;
        generate the control signal based on the correction signal; and
        switch between a first mode of operation and a second mode of operation without artifacts on the correction signal during switching between the first mode and the second mode.

2. The system of claim 1, wherein the control circuit is further configured to freeze the correction signal to a constant value during switching between the first mode and the second mode.

3. The system of claim 2, wherein the control circuit is further configured to:
    before switching between the first mode and the second mode, set a first filter configuration for filtering in the first mode;
    during switching between the first mode and the second mode, set a second filter configuration for filtering in a transition between the first mode and the second mode; and
    after switching between the first mode and the second mode, set a third filter configuration for filtering in the second mode.

4. The system of claim 3, wherein the control circuit is further configured to, during setting the second filter configuration, unfreeze the correction signal from the constant value.

5. The system of claim 1, wherein:
    the first mode comprises a low-power mode; and
    the second mode comprises a high-performance mode.

6. The system of claim 1, wherein the control circuit is further configured to:
    generate the output clock signal in a frequency-locked operation during the first mode; and
    generate the output clock signal in a phase-locked operation during the second mode.

7. The system of claim 1, wherein the external reference clock signal is selected from a first reference clock signal and a second reference clock signal.

8. The system of claim 7, wherein the control circuit is further configured to:
    select the first reference clock signal as the external reference clock signal in the first mode; and
    select the second reference clock signal as the external reference clock signal in the second mode.

9. The system of claim 8, wherein the control circuit is further configured to change selection of the external reference clock signal between the first reference clock signal and the second reference clock signal when switching between the first mode and the second mode.

10. The system of claim 9, wherein changing selection of the external reference clock signal between the first reference clock signal and the second reference clock signal when switching between the first mode and the second mode is synchronized to a clock signal.

11. The system of claim 1, further comprising a divider configured to divide the reference clock signal prior to being used by the control circuit to calculate the error signal.

12. The system of claim 1, further comprising a sampled data converter configured to receive the output clock signal as a synchronization signal for operation of the sampled data converter.

13. A method comprising, in a system including a digitally-controlled oscillator configured to generate an output clock signal based on a control signal received at an input of the digitally-controlled oscillator:
    calculating an error signal between the output clock signal and an external reference clock signal;
    filtering the error signal to generate a correction signal;
    generating the control signal based on the correction signal; and
    switching between a first mode of operation and a second mode of operation without artifacts on the correction signal during switching between the first mode and the second mode.

14. The method of claim 13, further comprising freezing the correction signal to a constant value during switching between the first mode and the second mode.

15. The method of claim 14, further comprising:
    before switching between the first mode and the second mode, setting a first filter configuration for filtering in the first mode;
    during switching between the first mode and the second mode, setting a second filter configuration for filtering in a transition between the first mode and the second mode; and
    after switching between the first mode and the second mode, setting a third filter configuration for filtering in the second mode.

16. The method of claim 15, further comprising, during setting the second filter configuration, unfreezing the correction signal from the constant value.

17. The method of claim 13, wherein:
the first mode comprises a low-power mode; and
the second mode comprises a high-performance mode.

18. The method of claim 13, further comprising:
generating the output clock signal in a frequency-locked operation during the first mode; and
generating the output clock signal in a phase-locked operation during the second mode.

19. The method of claim 13, wherein the external reference clock signal is selected from a first reference clock signal and a second reference clock signal.

20. The method of claim 19, further comprising:
selecting the first reference clock signal as the external reference clock signal in the first mode; and
selecting the second reference clock signal as the external reference clock signal in the second mode.

21. The method of claim 20, further comprising changing selection of the external reference clock signal between the first reference clock signal and the second reference clock signal when switching between the first mode and the second mode.

22. The method of claim 21, wherein changing selection of the external reference clock signal between the first reference clock signal and the second reference clock signal when switching between the first mode and the second mode is synchronized to a clock signal.

23. The method of claim 13, further comprising dividing the reference clock signal prior to being used by the control circuit to calculate the error signal.

24. The method of claim 13, further comprising communicating the output clock signal as a synchronization signal for operation of a sampled data converter.

* * * * *